US006474536B1

(12) United States Patent
Kukanskis

(10) Patent No.: US 6,474,536 B1
(45) Date of Patent: Nov. 5, 2002

(54) FLUX COMPOSITION AND CORRESPONDING SOLDERING METHOD

(76) Inventor: Peter Kukanskis, 245 Quassapaug Rd, Woodbury, CT (US) 06798

( * ) Notice: Subject to any disclaimer, the term of this patent is extended or adjusted under 35 U.S.C. 154(b) by 0 days.

(21) Appl. No.: 09/672,577

(22) Filed: Sep. 28, 2000

(51) Int. Cl.[7] .............................................. B23K 35/363
(52) U.S. Cl. ........................ 228/207; 228/208; 228/209; 228/262.9
(58) Field of Search ............................... 148/23, 24, 25; 228/207, 208, 209, 262.9

(56) References Cited

U.S. PATENT DOCUMENTS

| 3,925,112 A | * | 12/1975 | Petersen, Sr. et al. ........ 148/25 |
| 4,070,192 A | * | 1/1978 | Arbib et al. ............... 106/1.05 |
| 4,619,715 A | * | 10/1986 | Hwang ........................ 148/23 |
| 4,717,430 A | * | 1/1988 | Beal ............................ 148/24 |
| 5,397,383 A | * | 3/1995 | Wilczek et al. ............. 106/1.11 |
| 5,417,771 A |   | 5/1995 | Arita et al. |
| 5,549,761 A | * | 8/1996 | Winston et al. ................ 134/40 |
| 5,615,827 A |   | 4/1997 | Arldt et al. |
| 5,907,007 A |   | 5/1999 | Ito et al. |
| 5,935,640 A |   | 8/1999 | Ferrier et al. |
| 6,010,577 A |   | 1/2000 | Bristol et al. |
| 6,075,080 A |   | 6/2000 | Katsuoka et al. |
| 6,217,987 B1 | * | 4/2001 | Ono et al. ................... 428/209 |

* cited by examiner

Primary Examiner—Daniel J. Jenkins
(74) Attorney, Agent, or Firm—Camody & Torrance LLP

(57) ABSTRACT

A new soldering flux composition, as well as corresponding methods for soldering electronic components to printed circuit boards is disclosed. The new flux composition includes chemical reducing agents such as hydrazine, hydroxylamine, dimethylamine borane, and hydroquinone.

17 Claims, No Drawings

FLUX COMPOSITION AND CORRESPONDING SOLDERING METHOD

BACKGROUND OF THE INVENTION

1. Field of the Invention

The invention relates to a soldering flux adaptable to several different types of electronic soldering applications, including microelectronic applications. These soldering applications include the soldering of microelectronic chip components to printed circuit boards and to cermet conductor films on ceramic substrates, as well as the reflowing of solder on contact bumps of semiconductor wafers.

2. Description of the Prior Art

Commercially used fluxes are often tailored in composition for given soldering applications, depending on the needs of those particular applications. Typically fluxes are formulated around combinations of rosin based resins, organic acids, halide salts and/or chelators such as amine based chelators. The general object of these types of fluxes is to clean the surface to be soldered by removing and solubilizing any oxides on such surfaces thereby leaving clean active surfaces, which are more effectively soldered. In addition to the foregoing ingredients, surfactants, organic solvents such as alcohols, thickeners and waxes are added to fluxes for various purposes.

Fluxes are used in most soldering applications, but the most demanding applications that use fluxes are electronic or microelectronic soldering applications since the integrity of the soldered joint is critical, the cost of the components is high, rework is usually difficult or impossible and conductive residues must be minimized.

One electronic application involves the wave soldering of electronic components, such as resistors, capacitors and integrated circuits, to the metal patterns on printed circuit boards. In wave soldering the electronic components are temporarily bonded to the desired position on the metal pattern of the circuit board with a binder (i.e. temporary glue). The circuit board is then inverted for wave soldering, so that the electronic components to be soldered are disposed on the underside of the circuit board. Flux is then applied to this underside of the circuit board by horizontally moving the circuit board over a standing wave, or a spray, of flux. Next the fluxed board is horizontally moved over a standing wave of molten solder.

The soldering of electronic components to ceramic substrates has its own particular issues to consider. In this case the electronic components are soldered to a cermet conductor pattern on the ceramic substrate, while the substrate is face up. Generally, because of the prior processing of the conductors on the ceramic substrate, the ability of the flux to remove metallic oxides is particularly important.

Still another electronic soldering application involves semiconductor wafers having contact bumps thereon for each integrated circuit chip incorporated in the wafer. Solder is deposited on each contact bump. The solder bumps are fluxed and melted at least once to reflow the solder in order to obtain uniform bump height, geometry and appearance. In this application the subsequent cleanability of the flux is very important.

In all fluxing applications, the most fundamental requirement of a flux is to provide a clean, active solderable surface. In addition, the cleanability, lack of conductive residues, and tackiness of the flux can be important attributes in particular situations. In particular, in recent years, commercial interest in "no clean" and low residue fluxes has significantly increased. Measuring and reducing the ionic residues left behind by fluxes after soldering is particularly important. Lastly, interest in fluxes that can be cleaned away with aqueous solutions as opposed to organic solvent, particularly chloroflurocarbons, has increased greatly recently.

Frequently when manufacturing printed circuit boards, special coatings are applied to the portions of the conductive circuit pattern in order to preserve and/or enhance the solderability of these areas. Frequently these coatings consist of additional metal plating upon those areas in order to form coatings of silver, tin, bismuth or combinations thereof. In this regard please refer to U.S. Pat. No. 5,935,640 to Ferrier, et al., the teachings of which are incorporated herein by reference in their entirety.

U.S. Pat. No. 5,615,827 to Arldt, et al. discusses a flux composition comprising pimelic acid in conjunction with two organic solvents. It is noted that the flux leaves no ionic residues after the soldering process.

U.S. Pat. No. 6,075,080 to Katswoka, et al., discusses a flux comprising a particular polyamide resin U.S. Pat. No. 5,907,007 to Ito, et al., discusses a non-washing flux comprising a dibasic acid with a molecular weight of 250 or less, and a monobasic acid with a molecular weight of from 300 to 600.

U.S. Pat. No. 6,010,577 to Bristol, et al., discusses a soldering flux containing borneal. Borneal is said to help reduce ionic residue from the flux after soldering. U.S. Pat. No. 5,417,771 to Arita, et al., discusses a soldering flux comprising a bis (2-oxazoline) compound, a dithiol compound, an organic carboxylic acid compound and an activator. The teaching of U.S. Pat. Nos. 6,010,577 and 5,615,827 are incorporated herein by reference in their entirety.

It is an object of this invention to provide an improved soldering flux, particularly useful in soldering electronic components along with a method for utilizing the flux in an electronic soldering application. It is a further object of this invention to provide a flux, which works well when soldering to surfaces plated with silver, tin, bismuth or combination thereof.

SUMMARY OF THE INVENTION

The inventor herein has discovered that the inclusion of a chemical reducing agent in the flux composition will provide for improved flux performance. Fluxes incorporating chemical reducing agents have been found to be particularly useful in electronic soldering applications. The inventor has found that chemical reducing agents work particularly well in fluxes that are formulated to be cleanable with aqueous solutions, as opposed to organic solvents. In fact the inventor has discovered that not only is the incorporation of chemical reducing agents in standard flux compositions advantageous, but simple solutions of chemical reducing agents in water can act as effective fluxing agents.

DETAILED DESCRIPTION

As indicated, this invention proposes flux compositions comprising chemical reducing agents as at least one constituent thereof. The inventor has discovered that the inclusion of chemical reducing agents in flux compositions provides enhanced flux performance, particularly when the flux is used in preparing plated surfaces, especially immersion plated surfaces, for subsequent soldering.

Although not wanting to be bound by theory, it is believed that prior art fluxes work, in part, through their ability to remove surface oxides through dissolution via the acidic, chelating or other dissolution characteristics of the flux. In contrast to, and/or in addition to, the foregoing features, fluxes prepared in accordance with this invention are believed to have the ability to reduce, at least in part, surface oxides back to the base metal (i.e. zero valence state). Thus in addition to cleaning the surface and dissolving surface oxides, fluxes prepared in accordance with this invention provide solderable surfaces, in part, through reduction of the surface oxides back to the base metal or through preventing oxidation during the soldering process. This feature is particularly important when fluxing thinly plated surfaces since reduction of the surface oxides, as opposed to dissolution of the surface oxides, leaves more of the surface in tact (i.e. undissolved).

In the first embodiment, fluxes of this invention can be as simple as aqueous solutions of chemical reducing agents. In this case, it is believed that the flux operates primarily through reduction of the surface oxides back to the base metal. If desired, cleaning agents such as surfactants, organic solvents and/or alcohols may be added to enhance the cleaning ability or detergency of the flux. In addition, if desired, acids, particularly organic acids, such as citric acid, tartaric acid, and pimelic acid, or chelators such as ethylene diamine tetracetic acid, may be added to enhance the ability of the flux to dissolve surface oxides. Resins or thickeners may be added to increase the tackiness or viscosity of the flux. Lastly, other performance additives such as corrosion inhibitors may be added to enhance the performance of the flux in particular applications.

The chemical reducing agent used in the flux can be any chemical reducing agent, which has the ability to, at least in part, reduce the surface oxides, or other metallic salts, on the surface being fluxed back to the base metal. The inventor has found hydrazine, hydrazine hydrate, hydroxylamine, acid salts of hydroxylamine, hydroquinone dimethylaminoborane and the like to be particularly useful as chemical reducing agents in the fluxes of this invention. The concentration of the chemical reducing agent should be such that it is present in a sufficient amount to allow, reduction, of at least some of the surface oxides on the surface being fluxed, back to the base metal. Depending upon the particular chemical reducing agent chosen, and the matrix composition of the flux, the inventor has found that concentrations of the chemical reducing agent may range from about 1 to 150 grams per liter but are preferably from about 10 to 50 grams per liter.

If used with the fluxes of this invention, acid(s), preferably organic acids, are such that they completely volatilize during the soldering operation. In this regard pimelic acid, as discussed in U.S. Pat. No. 5,615,827 is particularly useful. If used, the concentration of the acids in the flux, depending upon the acid chosen, may range from about 1 to 150 grams per liter, but is preferably from 5 to 50 grams per liter.

As noted, if desired, cleaning agents such as surfactants, organic solvents and/or alcohols may be incorporated into the flux composition. Useful organic solvents or alcohols include isopropanol, bomeal, benzyl alcohol, n-propanol, propylene glycol monobutyl ether, diethylene glycol monomethyl ether and the like. Appropriate surfactants can be chosen to enhance the cleaning functionality of the flux on a particular surface or in a particular application. If used, the concentration of organic solvents and/or alcohols, in the aggregate, may range from about 5% to 80% by weight in the flux, but preferably range from about 5% to 50% by weight in the flux. If used, concentrations of surfactants in the flux composition may range from about 1 to 10 grams per liter but preferably ranges from 0.5 to 5 grams per liter.

Resin, such as rosin based resins or polyimide based resins, may be included in the flux composition. However, if included, these resins may cause the flux to be difficult to wash off of the parts after soldering and may in fact require organic solvents, such as chloroflurocarbons, to thoroughly and effectively clean the parts after soldering. If it is desired not to use such solvents in the cleaning operation, then resins should be avoided or carefully chosen such that the flux is easily cleaned in aqueous solutions after the soldering operation. Generally, fluxes formulated without resins are much more easily cleaned after the soldering operations.

Fluxes, including the fluxes described herein, may be incorporated into a paste with or without solder powder. If solder powder is included in the flux paste, the material is generally called a solder paste. Solder pastes are widely used in electronic soldering operations. In these cases, the solder paste is applied to the contact points on the electronic component to be soldered and/or on the corresponding contact points on the printed circuit board, creating regions bearing solder on such contact points. The electronic component is then temporarily adhered to the corresponding contact points on the printed circuit board with the solder paste. The assembly is then heated to at least the melting point of the solder in order to reflow the solder and complete the soldering operation. Thus using this method, fluxing and soldering are accomplished in one step using the solder paste.

The present invention will further be illustrated by way of the following examples, which are not meant to be limiting in any manner.

EXAMPLES 1–5

Copper clad panels were plated using an immersion silver-plating bath such that all of the copper surfaces were uniformly coated with silver plate. The panels were then kept in a typical industrial environment with free access of air to the surface for two months. At the end of the two-month period, a thin layer of slightly yellow silver salts had formed over the silver surface such that the formerly bright silver surface now looked tarnished and slightly yellow.

The panels were then divided into five groups and each group of panels was immersed in one of the following flux solutions for one minute at room temperature, rinsed in deionized water and then dried:

COMPOSITION

Flux Solution No. 1: 10 g/l hydroquinone in aqueous solution

Flux Solution No. 2: 10 g/l dimethylaminoborane in aqueous solution

Flux Solution No. 3: 10 g/l hydrazine sulfate in aqueous solution

Flux Solution No. 4: 10 g/l hydrazine hydrate in aqueous solution

Flux Solution No. 5: 10 g/l hydroxylamine in aqueous solution

In each case the panels were bright, shiny and silver colored in appearance after treatment in the foregoing flux solutions. The tarnished yellow appearance had disappeared.

Each of the panels was the dipped in molten solder (63/37 tin/lead) at 475° F. for 3 seconds. Solder uniformly coated the surfaces of all of the panels.

COMPARATIVE EXAMPLE

Copper clad panels were treated in same manner as in Examples 1–5 except that in this case they were processed through the following flux:

Interflux 2005M, commercially available from Interflux U.S.A., Inc. of Dallas, Tex.

After treatment in the flux the appearance of the panels remained tarnished and yellowish.

Each of the panels was then dipped in molten solder (63/37 tin/lead) at 475° F. for 3 seconds. The solder did not uniformly coat the surface, which appeared uneven and pitted.

What is claimed is:

1. A method for mounting an electronic component onto a printed circuit board, which electronic component includes contact points and which printed circuit board includes contact points corresponding to said electronic component contact points, said electronic component contact points bearing regions of solder and said printed circuit board contact points comprising an immersion plated coating comprising a metal selected from the group consisting of silver, tin, bismuth or combinations thereof, said method comprising the steps of:
   a. supplying a printed circuit board with contact points comprising an immersion coating comprising a metal selected from the group consisting of silver, tin, bismuth or combinations thereof;
   b. applying a flux composition to said printed circuit board contact points and/or said electronic component contact points;
   c. positioning said electronic components such that the electronic component contact points touch the corresponding printed circuit board contact points;
   d. applying heat such that at least a portion of the regions of solder melt and flow;
   wherein said flux composition comprises a chemical reducing agent.

2. A method according to claim 1, wherein the chemical reducing agent is selected from the group consisting of hydrazine, hydrazine hydrate, hydroxylamine, acid salts of hydroxylamine, dimethylaminoborane, hydroquinone, and mixtures of the foregoing.

3. A method according to claim 1 also comprising at least one material selected from the group consisting of surfactants, organic solvents, alcohols, organic acids, chelators, resins, corrosion inhibitors and mixtures of the foregoing.

4. A method according to claim 1, wherein the flux composition also comprises at least one alcohol and at least one organic acid.

5. A method according to claim 1, wherein the flux composition also comprises at least one material selected from the group consisting of alcohols, organic solvents, organic acids and mixtures of the foregoing.

6. A method according to claim 2, wherein the flux composition also comprises at least one material selected from the group consisting of surfactants, organic solvents, alcohols, organic acids, chelators, resins, corrosion inhibitors and mixtures of the foregoing.

7. A method according to claim 2, wherein the flux composition also comprises at least one alcohol and at least one organic acid.

8. A method according to claim 2, wherein the flux composition also comprises at least one material selected from the group consisting of alcohols, organic solvents, organic acids and mixtures of the foregoing.

9. A method according to claim 2, wherein the flux composition also comprises solder powder.

10. A method for mounting an electronic component onto a printed circuit board, which electronic component includes electrically conductive members extending from said component and which printed circuit board includes plated through holes extending from a first surface to a second surface of said printed circuit board, said method comprising the steps of:
    a. supplying a printed circuit board with plated through holes extending from a first surface to a second surface of said printed circuit board and wherein said plated through holes comprise an immersion plated coating comprising a metal selected from the group consisting of silver, tin, bismuth or combinations thereof;
    b. applying a flux composition to said electrically conductive members and/or said plated through holes;
    c. prior to, during or after said flux applying step, positioning said electronic component adjacent to said first surface of said printed circuit board so that said electrically conductive members extend into, or are positioned adjacent to, said plated through holes; and
    d. impinging liquid solder into plated through holes such that the solder contacts said electrically conductive members;
    wherein said flux composition comprises a chemical reducing agent.

11. A method according to claim 10 wherein the chemical reducing agent is selected from the group consisting of hydrazine, hydrazine hydrate, hydroxylamine, acid salts of hydroxylamine, dimethylamine borane, hydroquinone and mixtures of the foregoing.

12. A method according to claim 10, wherein the flux composition also comprises at least one material selected from the group consisting of surfactants, organic solvents, alcohols, organic acids, chelators, resins, corrosion inhibitors and mixtures of the foregoing.

13. A method according to claim 10, wherein the flux composition also comprises at least one alcohol and at least one organic acid.

14. A method according to claim 10, wherein the flux composition also comprises at least one material selected from the group consisting of alcohols, organic solvents, organic acids and mixtures of the foregoing.

15. A method according to claim 11, wherein the flux composition also comprises at least one material selected from the group consisting of surfactants, organic solvents, alcohols, organic acids, chelators, resins, corrosion inhibitors and mixtures of the foregoing.

16. A method according to claim 11, wherein the flux composition also comprises at least one alcohol and at least one organic acid.

17. A method according to claim 11, wherein the flux composition also comprises at least one material selected from the group consisting of alcohols, organic solvents, organic acids and mixtures of the forgoing.

* * * * *